United States Patent
Chen et al.

(10) Patent No.: US 6,548,893 B1
(45) Date of Patent: Apr. 15, 2003

(54) APPARATUS AND METHOD FOR HERMETICALLY SEALING AND EMI SHIELDING INTEGRATED CIRCUITS FOR HIGH SPEED ELECTRONIC PACKAGES

(75) Inventors: Yu Ju Chen, San Ramon, CA (US); Hui Wu, Milpitas, CA (US)

(73) Assignee: BigBear Networks, Inc., Milpitas, CA (US)

( * ) Notice: Subject to any disclaimer, the term of this patent is extended or adjusted under 35 U.S.C. 154(b) by 0 days.

(21) Appl. No.: 09/898,567

(22) Filed: Jul. 3, 2001

(51) Int. Cl.[7] ............................................... H01L 23/12
(52) U.S. Cl. ..................... 257/704; 257/693; 257/710; 257/728
(58) Field of Search ................................ 257/704, 693, 257/710, 728; 438/125

(56) References Cited

U.S. PATENT DOCUMENTS

| | | | | |
|---|---|---|---|---|
| 3,784,883 A | * | 1/1974 | Duncan et al. | 317/234 R |
| 5,103,291 A | * | 4/1992 | Lian-Mueller | 357/74 |
| 5,455,387 A | * | 10/1995 | Hoffman et al. | 174/52.4 |
| 5,770,890 A | * | 6/1998 | Dreyer et al. | 257/710 |
| 5,869,896 A | * | 2/1999 | Baker et al. | 257/724 |
| 5,945,735 A | * | 8/1999 | Economikos et al. | 257/710 |

OTHER PUBLICATIONS

Tsukiyama et al.; "High Frequency Package"; U.S. Patent Application Publication; US 2001/0004129; Pub. Date Jun. 2001, 2001.*

* cited by examiner

Primary Examiner—Hoai Ho
Assistant Examiner—Tu-Tu Ho

(57) ABSTRACT

An apparatus and method for hermetically sealing, EMI shielding integrated circuits for high-speed electronic devices using a combination of microstrip to buried stripline interface for signal transmission from the integrated circuit. The packaging provided comprises a first plurality of microstrips interconnecting the integrated circuit to a plurality of buried striplines exposed on a surface of the main substrate. A ceramic interposer placed over the main substrate "buries" a portion of the exposed striplines on the main substrate to thereby insulate these signal paths from a hermetically sealing, and EMI shielding metal lid placed over the integrated circuit. The metal lid and the seal ring brazed over the ceramic interposer thus provide both a hermetic seal and an electric radiation block. A reduction in dispersion due to the buried striplines is also achieved, as well as improving jitter performance.

21 Claims, 4 Drawing Sheets

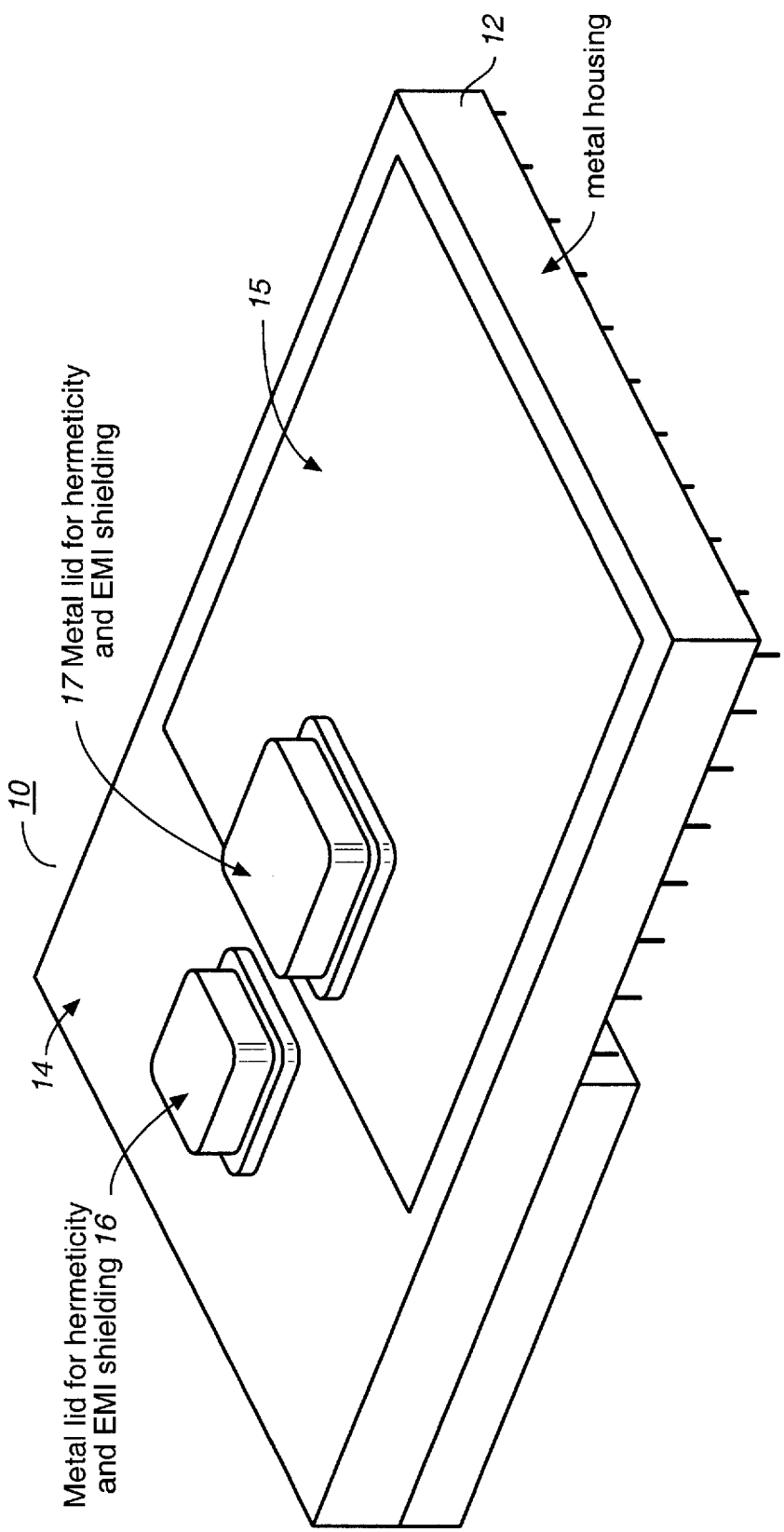
FIG._1

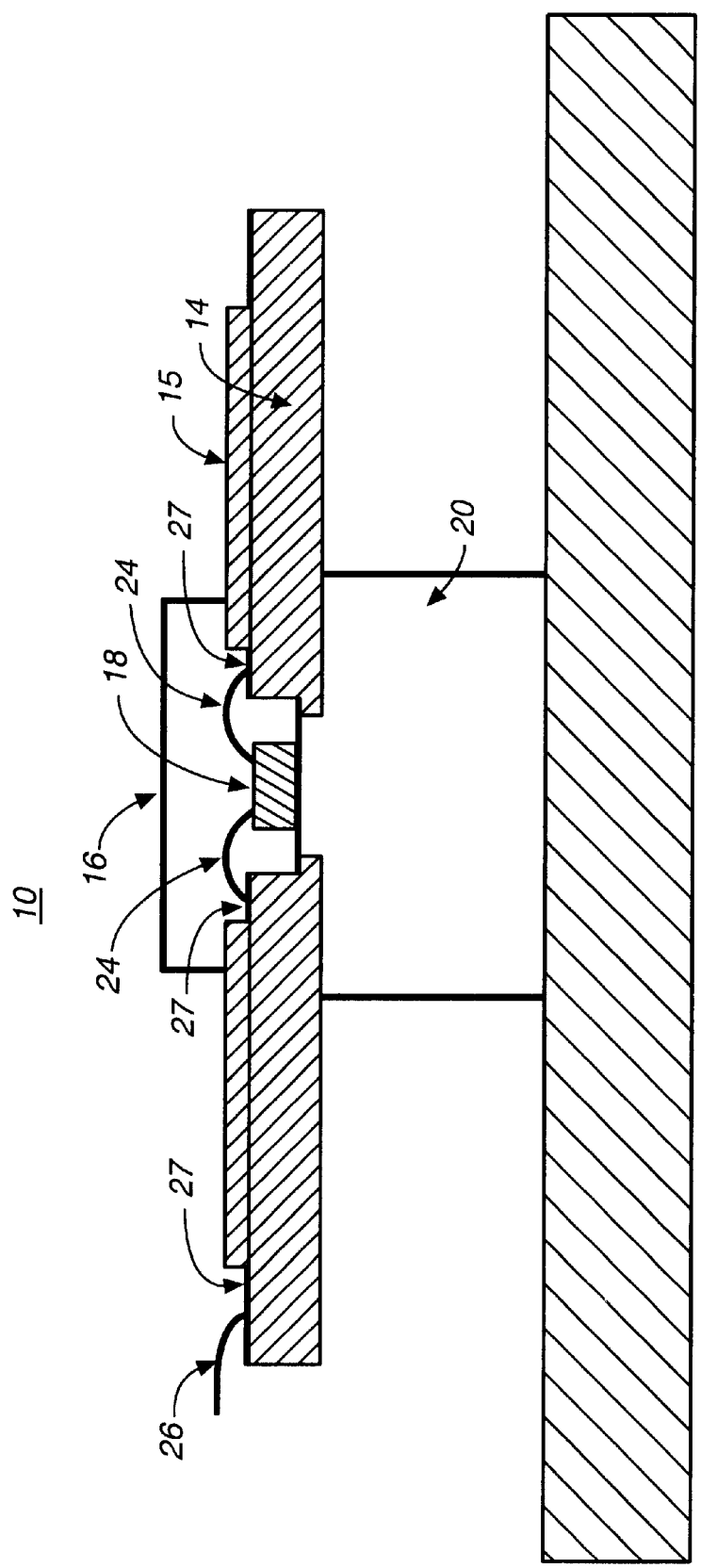
FIG._2

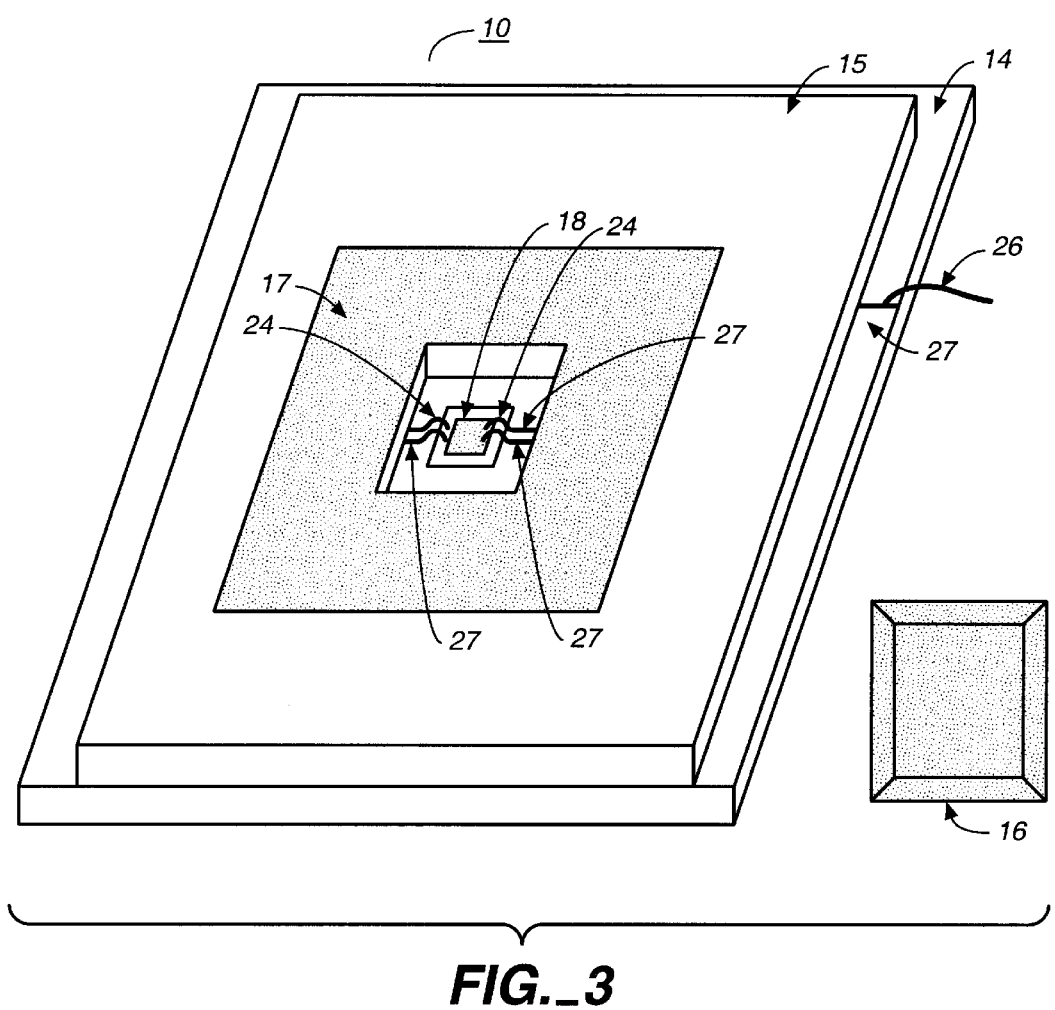
FIG._3

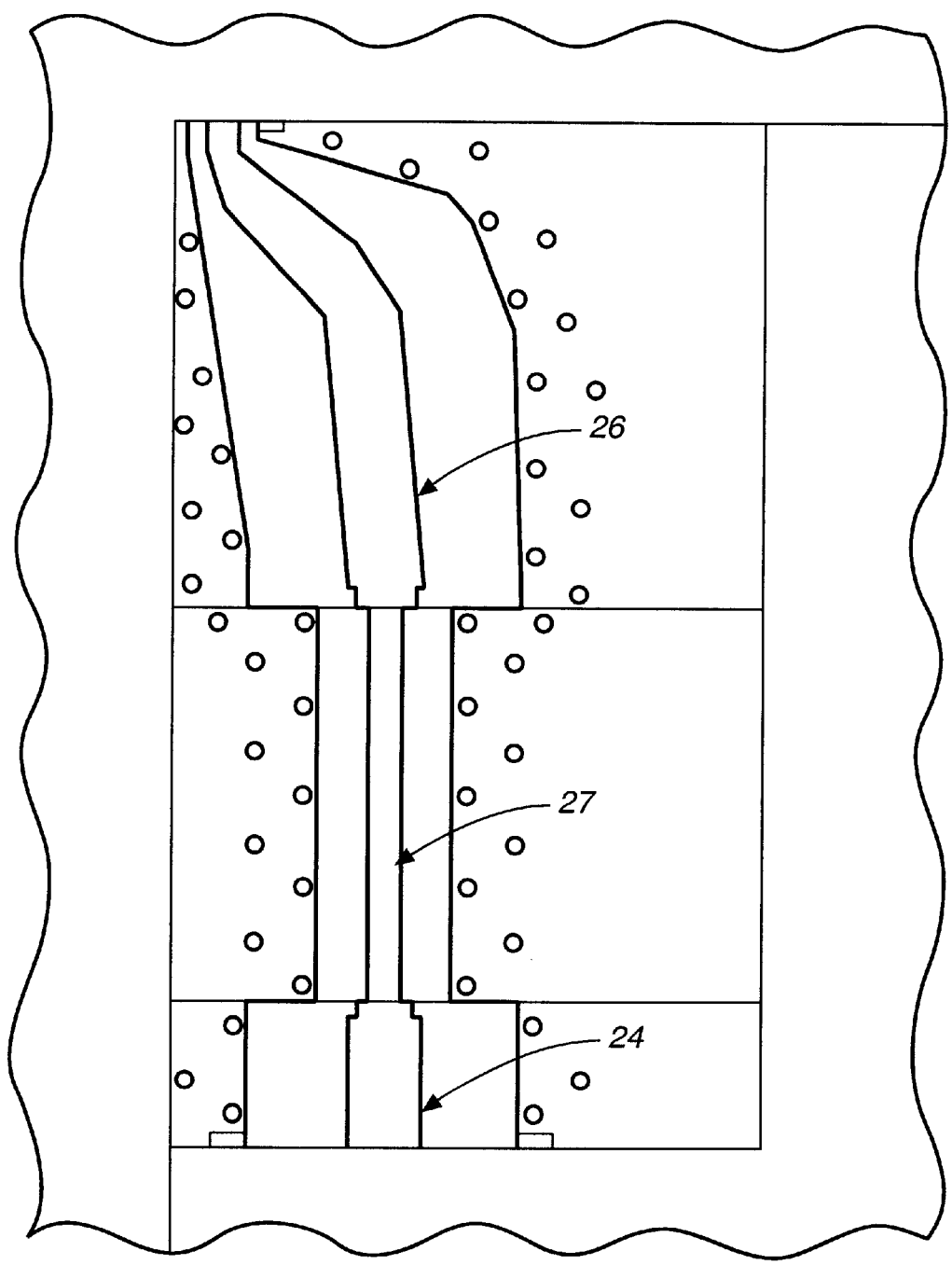
FIG._4

APPARATUS AND METHOD FOR HERMETICALLY SEALING AND EMI SHIELDING INTEGRATED CIRCUITS FOR HIGH SPEED ELECTRONIC PACKAGES

FIELD OF INVENTION

This invention relates to packaging methodologies for high-speed integrated circuits, more particularly to hermetically sealing and EMI shielding for high-speed communication devices.

BACKGROUND OF INVENTION

Packaging technology for integrated circuits is well known, particularly relating to methods of hermetically sealing, or EMI shielding the packages. However, with very broadband integrated chips designs, the high-speed signal traces are routed to the surface, or topside of the chip, thereby creating a difficulty for hermetically sealing, or adequately EMI shielding the packages without shorting signals or affecting signal integrity. There is therefore a need to provide a hermetic environment for chip reliability, as well as shielding of electromagnetic radiation to the environment.

SUMMARY OF INVENTION

An apparatus and method for hermetically sealing, EMI shielding integrated circuits for high-speed electronic devices using a combination of microstrip to buried stripline interface for signal transmission from the integrated circuit. The packaging provided according to the principles of this invention comprise a first plurality of microstrips interconnecting the integrated circuit to a plurality of buried striplines exposed on a surface of the main substrate, whereby it is contemplated that these striplines may carry high-speed signals, or other electrical signals. A ceramic interposer placed over the main substrate "buries" a portion of the exposed striplines on the main substrate to thereby insulate these signal paths from a hermetical seal, and EMI shielding metal lid placed over the integrated circuit. The metal lid and the seal ring brazed over the ceramic interposer thus provide both a hermetic seal and an electric radiation block. A reduction in dispersion due to the buried striplines is also achieved thereby improving jitter performance. The packaging thus provided also prevents possible radiation from the transmission lines themselves, not just radiation from the chip and bond wires.

BRIEF DESCRIPTION OF DRAWINGS

FIG. 1 shows a hermetically sealed and EMI shielded high-speed electronic package provided in accordance with the principles of this invention.

FIG. 2 shows a cross-sectional view of the hermetically sealed and EMI shielded high-speed package of FIG. 1.

FIG. 3 shows a top cross-sectional view of the hermetically sealed and EMI shielded high-speed package of FIG. 1.

FIG. 4 illustrates a top skeletal view of a plurality of buried striplines between a first and a second plurality of microstrips shown in FIGS. 1–3.

DETAILED DESCRIPTION OF PREFERRED EMBODIMENT(S)

The packaging provided according to the principles of this invention comprises a first plurality of microstrips interconnecting the integrated circuit to a plurality of buried striplines exposed on a surface of the main substrate, whereby it is contemplated that these striplines may carry high-speed signals, or other electrical signals. A ceramic interposer placed over the main substrate "buries" a portion of the exposed striplines on the main substrate to thereby insulate these signal paths from a hermetically sealing, and EMI shielding metal lid placed over the integrated circuit. The metal lid and the seal ring brazed over the ceramic interposer thus provide both a hermetic seal and an electric radiation block.

FIG. 1 shows a hermetically sealed and EMI shielded high-speed electronic package 10 provided in accordance with the principles of this invention. In the preferred embodiment, a metal seal ring 17 is brazed to a ceramic interposer 15. A metal seal ring lid 16 is brazed over the metal seal ring 17 to hermetically seal in an integrated circuit 18 (see FIG. 2) underlying the metal lid 16. Moreover in this configuration, EMI shielding and protection from chip damage is provided. Alternatively, one can braze or use epoxy to adhere lid 16 directly to a first substrate 14 without seal ring 17. In yet another embodiment, lid 16 and seal ring 17 can comprise non-metal material, such as ceramic, as in cases where EMI shielding is not necessary.

FIG. 2 shows a more detailed cross-sectional view of the hermetically sealed and EMI shielded high-speed integrated circuit package 10 of FIG. 1. In the preferred embodiment shown, an integrated circuit 18 is placed over a heat sink 20, or other cooling devices, such as a TEC. A ceramic interposer 15 is placed over a main substrate 14 to insulate a plurality of buried striplines 27 carrying high-speed signals, or other electrical signals, on a surface of substrate 14. A first plurality of microstrip 24 of a first line width is provided to electrically connect integrated circuit 18 to the plurality of buried stripline 27, while a second plurality of microstrip lines 26 couples the buried striplines 27 from substrate 14 to another signal destination, such as to another integrated circuit, a signal connector, another substrate, and other target signal destination. In the preferred embodiment, steps, such as discrete line width decrements from one line width to another can be used to transition between the line width of microstrips 24 or 26 to the line width of buried striplines 27, since striplines 27 may be of a line width much smaller than the line width of microstrip 24 or 26. The line width ratio of microstrips 24 or 26 to striplines 27 is conditioned upon impedance matching requirements to meet optimal performance.

FIG. 3 provides another perspective, a top cross-sectional view of the hermetically sealed and EMI shielded high-speed package of FIG. 1. As shown, microstrips 24 provides the signal paths for electrical signals from integrated circuit 18 to buried striplines 27 on substrate 14, while microstrips 26 carries signals from substrate 14 to target signal destination, such as another substrate, integrated circuits, connector.

In the preferred embodiment shown in FIG. 3, metal seal ring 17 is brazed to ceramic interposer 15, while metal seal ring lid 16 is brazed over seal ring 17 to provide both a hermetic seal and EMI shielding of integrated circuit 18. It is also contemplated that a glass seal can be provided between ceramic interposer 15 and main substrate 14 to further enhance the hermetic seal about integrated circuit 18. In yet another embodiment, it is also contemplated that hermetic seal lid 16 may be brazed directly to ceramic interposer 15. Moreover, where EMI shielding is not critical to the packaging, hermetic seal lid 16 and seal ring 17 may comprise non-metal material, such as ceramic.

FIG. 4 illustrates a top skeletal view of the step transitions from a first plurality of microstrips 24 from IC 18 to a plurality of buried striplines 27 to a second plurality of microstrips 26. Microstrips 24 and 26 may comprise ribbons, wire bonds, or other signal carrying connectivities. It is also contemplated that buried striplines 27 will comprise a much smaller line width than the line width of microstrips 24 and 26. Accordingly, in the preferred embodiment, step transition provides discrete decrements of line width of microstrips 24 and 26 down to the narrower line width of buried striplines 27. Taking discrete decrements in the line width yield bandwidths beyond 40 GHz. Alternatively, step transition of striplines 27 may be used to transition to the wider line width of microstrips 24 and 26. Thus, depending on the line width ratio of microstrips 24 or 26 to buried striplines 27, it is considered within the scope of this invention to provide for such line width difference with step transition of either microstrips 24 and 26, or of buried striplines 27. This method of step transitioning between different line widths could also be applicable to provide for any line width of microstrips 24 or 26 and striplines 27.

Accordingly, it is provided in accordance with the principles of this invention an apparatus and method for hermetically sealing, EMI shielding integrated circuits for high-speed electronic devices using a combination of microstrip to buried stripline interface for signal transmission from the integrated circuit. A metal lid and a seal ring brazed over the ceramic interposer thus provide both a hermetic seal and an electric radiation block. A reduction in dispersion due to the buried striplines is also achieved resulting in improved jitter performance. The packaging thus provided also prevents possible radiation from the transmission lines themselves, not just radiation from the chip and bond wires.

Foregoing described embodiments of this invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A hermetically sealed integrated circuit package for high-speed electronic devices comprising:
    a ceramic interposer, wherein the ceramic interposer covers a portion of a plurality of buried striplines provided on a surface of a main substrate to thereby provide electrical insulation of the buried striplines;
    an integrated circuit, the integrated circuit electrically coupled to the plurality of buried striplines of the main substrate via a first plurality of microstrips having a first line width;
    a second plurality of microstrips of a second line width, the second plurality of microstrips electrically coupling the plurality of buried striplines from the main substrate to one or more target signal destinations to thereby provide electrical signal transmissions from the integrated circuit to the one or more signal destinations; and
    a packaging lid hermetically sealed to the ceramic interposer and shielding the integrated circuit.

2. The hermetically sealed integrated circuit package of claim 1 wherein the first line width differs from a line width of the plurality of buried striplines, and wherein the first plurality of microstrips comprise one or more discrete line width adjustments to thereby adjust to the line width difference to the plurality of buried striplines.

3. The hermetically sealed integrated circuit package of claim 1 wherein the second line width differs from a line width of the plurality of buried striplines, and wherein the second plurality of microstrips comprise one or more discrete line width adjustments to thereby adjust to the line width difference to the plurality of buried striplines.

4. The hermetically sealed integrated circuit package of claim 1 wherein the first line width comprises about an equivalent line width of the second line width, while the first line width differs from a line width of the plurality of buried striplines, and wherein both the first and second plurality of microstrips comprise one or more discrete line width adjustments to thereby adjust to the line width difference between the first and second plurality of microstrips to the line width of the plurality of buried striplines.

5. The hermetically sealed integrated circuit package of claim 1 wherein the first or second line width differs from a line width of the buried striplines, and wherein the plurality of buried striplines comprise one or more discrete line width adjustments to thereby adjust to a line width difference between the plurality of buried striplines to the first or second plurality of microstrips.

6. The hermetically sealed integrated circuit package of claim 1 further comprising a glass seal between the ceramic interposer and the main substrate for added hermeticity.

7. The hermetically sealed integrated circuit package of claim 1 wherein the packaging lid comprises a seal ring lid over a seal ring, with the seal ring sealed to the ceramic interposer and seal ring lid sealed to the seal ring to shield the integrated circuit.

8. The hermetically sealed integrated circuit package of claim 1 wherein the packaging lid comprises metal.

9. The hermetically sealed integrated circuit package of claim 7 wherein the seal ring lid comprises metal.

10. The hermetically sealed integrated circuit package of claim 7 wherein the seal ring comprises metal.

11. The hermetically sealed integrated circuit package of claim 7 wherein the seal ring lid and the seal ring comprise metal.

12. The hermetically sealed integrated circuit package of claim 1 wherein the packaging lid comprises ceramic.

13. A method for hermetically sealing an integrated circuit for high speed electronic packages comprising the steps of:
    providing a first plurality of microstrips of a first line width and electrically coupling the first plurality of microstrips from the integrated circuit to a plurality of buried striplines of the main substrate to thereby provide electrical signal transmission from the integrated circuit to the plurality of buried striplines;
    providing a second plurality of microstrips of a second line width, and electrically coupling the second plurality of microstrips from the plurality of buried striplines to one or more target signal destinations to thereby provide electrical signal transmission from the integrated circuit to the one or more target signal destinations;
    providing a ceramic interposer to electrically shield a portion of the buried striplines on the main substrate; and
    hermetically sealing the integrated circuit with a packaging lid over the integrated circuit and a portion of the ceramic interposer to provide a hermetic seal and to shield the integrated circuit.

14. The method for hermetically sealing an integrated circuit of claim 13 wherein the step of hermetically sealing the integrated circuit with a packaging lid comprises brazing the packaging lid to the ceramic interposer.

15. The method for hermetically sealing an integrated circuit of claim 13 wherein the first or second plurality of microstrips comprise one or more line width adjustments to adjust to a line width of the plurality of buried striplines.

16. The method for hermetically sealing an integrated circuit of claim 13 wherein the plurality of buried striplines comprise one or more line width adjustments to adjust to a line width difference to the first or second microstrips.

17. The method for hermetically sealing an integrated circuit of claim 13 wherein the step of providing the ceramic interposer further comprises first providing a glass seal over a portion of the plurality of striplines on the main substrate, then providing a ceramic interposer over the glass seal to thereby enhance the hermetic seal around the integrated circuit.

18. The method for hermetically sealing an integrated circuit of claim 13 wherein the packaging lid comprises metal.

19. The method for hermetically sealing an integrated circuit of claim 13 wherein the packaging lid comprises a seal ring sealed to the ceramic interposer, the seal ring having a seal ring lid over the seal ring to hermetically seal the integrated circuit.

20. The method for hermetically sealing an integrated circuit of claim 19 wherein the seal ring comprises metal.

21. The method for hermetically sealing an integrated circuit of claim 19 wherein the seal ring lid comprises metal.

* * * * *